United States Patent [19]

de Mesmaeker et al.

[11] 4,308,565

[45] Dec. 29, 1981

[54] METHOD AND APPARATUS FOR FAULT DIRECTION DETERMINATION

[75] Inventors: Ivan de Mesmaeker, Fislisbach; Peter Müller, Nussbaumen, both of Switzerland

[73] Assignee: BBC Brown, Boveri & Company Limited, Baden, Switzerland

[21] Appl. No.: 38,514

[22] Filed: May 14, 1979

[30] Foreign Application Priority Data

Jun. 1, 1978 [CH] Switzerland ............... 6203/78

[51] Int. Cl.³ ............................................. H02H 3/28
[52] U.S. Cl. ........................................ 361/80; 324/52; 361/84
[58] Field of Search ................... 361/16, 79, 80, 82, 361/83, 84; 324/52

[56] References Cited

U.S. PATENT DOCUMENTS

| | | | |
|---|---|---|---|
| 3,303,390 | 2/1967 | Sonnemann | 361/80 |
| 4,092,690 | 5/1978 | Wilkinson | 361/80 |
| 4,249,124 | 2/1981 | De Mesmaeker | 361/80 X |

*Primary Examiner*—Harry E. Moose, Jr.
*Attorney, Agent, or Firm*—Werner W. Kleeman

[57] ABSTRACT

A method and apparatus for fault direction determination is disclosed wherein a capacitor is connected in series in a line or network having a relay arrangement or scheme possessing directional and distance characteristics. To prevent faulty tripping of the relay arrangement, caused by the effect of the series capacitance in the line, the relay arrangement is structured such that the integrity of the directional characteristics thereof is maintained. Positive tripping of the relay is maintained, especially in the event of near faults which usually are most affected by the action of the series capacitance.

14 Claims, 3 Drawing Figures

METHOD AND APPARATUS FOR FAULT DIRECTION DETERMINATION

BACKGROUND OF THE INVENTION

The present invention relates to a new and improved method of, and apparatus for, the determination of the fault direction with respect to a measuring location at electrical lines or networks containing a series capacitor or capacitance.

The prior art is already acquainted with methods and apparatuses for fault direction determination with respect to a measuring location or site at electrical lines having series capacitance, wherein the phase angle of the difference of an equivalent or image line voltage signal $U_E$ and a line voltage signal $U_K$ at the measuring location in relation to a reference voltage $U_r$ signal are compared with a threshold or limit value, typically especially 90°. Upon exceeding or falling below this threshold value there is derived a fault direction signal. As the line-image voltage signal there is employed the potential drop at an image or equivalent impedance to which there is applied a line current signal. In the relay trip or forward direction, considered with respect to the measuring location and determined by the positive direction of current flow, a line or network section is provided with a line impedance $Z_{Lr}$ and a current source having a source impedance $Z_{Sr}$. The magnitude of the source impedance can be the same or greater than that of the line impedance.

The series capacitance or capacitor which is arranged in the current path of such circuit configurations serves, in known manner, to extensively compensate the inductive reactance of the line and is usually provided with a bridging spark gap or path which, in the event of short-circuit currents flowing through the capacitor, fires or arcs over above a certain threshold or limit by virtue of the corresponding potential drop across the capacitor and protects the latter against overloading. If there is presupposed that between the capacitor and a current source, which in the equivalent circuit diagram has a source impedance, there is present a line impedance, then while taking into account usual spark gap settings, it will be apparent that there is not insured for any reliable response of the spark gap when the magnitude of the source impedance with respect to that of the line section between the source and the capacitor is the same or greater. This is so because in conjunction with the line impedance the source impedance then provides a total impedance value which, under certain circumstances, does not sufficiently limit the short-circuit current to values adequate for response of the spark gap. Without bridging the capacitor by the low resistance arc of the ignited spark gap, there then appear, following a short-circuit near to the capacitor, at its rear side, i.e. the side facing away from the source feeding the short-circuit, transient oscillations having a frequency essentially determined by the capacitance of the capacitor and the inductances (line and source inductances) which are effective in the resonant circuit. These oscillations of the short-circuit current lead to faults or disturbances in the function of a directional or distance relay arranged, for instance, between the capacitor and the line. This relay should respond to short-circuits appearing at the line between the relay and the source, i.e. in the sense of triggering a fault cut-off, however in the event of faults at the rear side of the capacitor, as the same has been previously assumed, this relay should however block. The faulty operation, as has been found in practice, is attributable to the fact that notwithstanding a fault position at the rear of the relay, i.e. in the blocking area, there nontheless occurs a tripping or response of the relay. The reverse faulty operation, wherein namely in the event of a short-circuit at the line in the forward direction of the relay (i.e., that direction with respect to the relay site where the relay should respond and trip in the presence of short-circuits) the relay does not trip, does not really occur in practice due to transient current oscillations. The forward direction of a relay of standard design having a line-image voltage signal and a difference voltage signal, whose phase is monitored in relation to a reference voltage and compared with a threshold value or limit of typically 90° (circular trip characteristic or region in the complex impedance plane), is determined by the positive flow direction at the line or in the image or equivalent impedance.

SUMMARY OF THE INVENTION

It is a primary object of the present invention to provide a new and improved method of, and apparatus for, fault direction determination in a positive and reliable manner, wherein relay tripping is insured notwithstanding the presence of a series capacitance in the line which otherwise might adversely affect the proper operating capability of the relay.

Another and more specific object of the present invention aims at a novel method and apparatus for fault direction determination, wherein, also in the event of the spark gap of the series capacitor not responding, there is insured with increased reliability against faulty tripping of the relay in the presence of short-circuits at the rear of the capacitor.

Yet a further significant object of the present invention aims at providing a new and improved method and apparatus for fault direction determination wherein a relay scheme having directional and distance characteristics is structured such that the integrity of the direction characteristics of the relay, which otherwise might be adversely affected by series capacitance in the network or line, is maintained.

Now in order to implement these and still further objects of the invention, which will become more readily apparent as the description proceeds, the method aspects of the invention contemplate performing the fault direction determination simultaneous with or in place of the shortest protection zone setting of a multi-zone staggered fault distance monitoring, and there is obtained the line-image voltage signal by means of an image or replica impedance, the magnitude of which is larger than the magnitude of the line impedance which corresponds to the shortest protection zone of the fault distance monitoring.

As far as the apparatus for fault direction determination with respect to measuring location at electrical lines having a series capacitor is concerned, there is provided a phase angle-threshold value detector connected at its input side with a difference signal former and a reference voltage transmitter. The difference signal former is connected at its input side at an image impedance through which flows a line current signal and at a signal transmitter operatively associated with the line voltage at the measuring location. A distance protection relay is provided at the same measuring location and correlated with the shortest protection zone setting of the relay having staggered, switchable protection zone settings. The magnitude of the aforementioned image impedance is greater than the magnitude of a line impedance corresponding to the shortest protection zone of the distance protection relay.

Some of the more basic concepts of the invention may be summarized as follows: The citical magnitude in the relay function is the previously mentioned difference voltage signal, namely the difference between the line voltage signal at the measuring location and the line-image voltage signal. This is so because there is contained in such magnitude the line current having the transient oscillations or an appropriate current signal, and specifically in the form of the potential drop at the impedance (the sum of the line and source impedances) in the forward direction of the relay, on the one hand, and at the image impedance, on the other hand. Now if the image impedance is set to a value which is greater than that of the shortest protection zone at the line, i.e. greater than the image impedance of the first stage of a conventional distance relay having multi-zone, staggered fault distance monitoring, then there is more or less accomplished an extensive compensation of the current oscillations within the difference voltage signal. This is so because the line voltage signal contains, apart from the source voltage which practically is without harmonics, the negative voltage drop at the forward impedance owing to the reversal of the current direction in the event of reverse faults, and the image voltage signal which is to be subtracted therefrom is likewise negative owing to the reversal of the current direction. Hence, the line current contains a factor which is determined by the difference between the image impedance and the forward impedance. However, this difference magnitude becomes smaller with image impedances which increase beyond the line impedance, i.e., with certain deviations of the conventional first protection zone setting of the distance relay, so that there is produced a reduced effect of the transients. If the image and forward impedances are the same, then this effect is practically completely compensated or balanced out. With larger image impedance the degree of compensation again is reduced, but however remains within the region between the lower threshold defined by the conventional setting of the first stage or zone of the aforementioned distance relay and an upper threshold governed from the standpoint of suitable practical design, this upper threshold in any event lying above the forward impedance, and thereby attaining a basic compensation effect. This means that the fault direction determination i.e., the non-tripping or blocking of the relay, can be rendered more reliable during the reverse faults or short-circuits which are critical as concerns the transients. Since, however, the monitoring function for the first zone is lost due to the changed relay setting, there is additionally assumed a conventional distance relay having an appropriately set or adjusted first protection zone. By simply conjunctively processing the tripping and blocking signals of both relays, i.e. that having changed image impedance and that with the usual image impedance for the first protection zone, there can be thus detected and blocked faulty relay tripping in the presence of reverse faults, especially close-up faults.

BRIEF DESCRIPTION OF THE DRAWINGS

The invention will be better understood and objects other than those set forth above, will become apparent when consideration is given to the following detailed description thereof. Such description makes reference to the annexed drawings wherein.

DETAILED DESCRIPTION OF THE PREFERRED EMBODIMENTS

Figure 1:
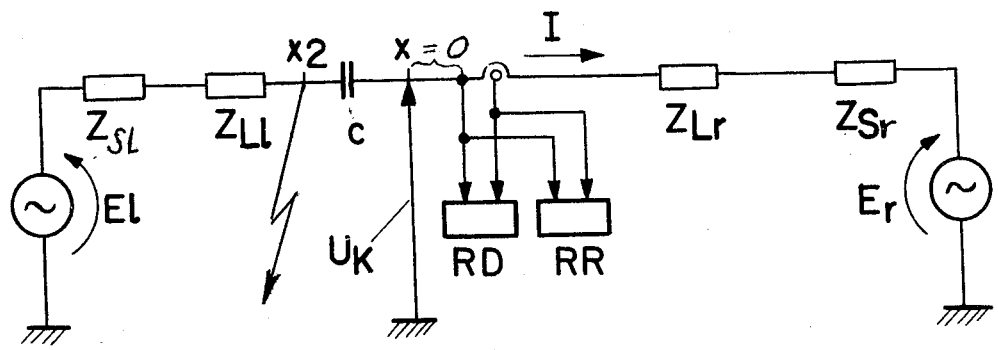
FIG. 1 is a schematic circuit diagram showing a single-phase network having, in relation to a measuring location x=O equipped with directional relay RR and distance relay RD, symmetrical line sections $Z_{Ll}$, $Z_{Lr}$ and power in-feed at two sides by means of the source voltages $E_l$, $E_r$, as well as related source impedances $Z_{Sl}$, $Z_{Sr}$, and further containing a series capacitor C.

Describing now the drawings, according to the circuit arrangement shown in FIG. 1 there is measured at a measuring location or site x=O the line voltage or potential $U_K$ and the line current I and each such magnitude is converted into an appropriate signal. The arrows indicate the direction counted to be positive in each case (counting arrows) which also is important for the circuit arrangement of FIG. 2 and the therein illustrated difference formation or generation for the difference voltage signal $U_d$. Accordingly, the relays RD and RR, connected in parallel at the measuring side, respond to short-circuits or faults appearing to the right of the measuring location or point x=O of FIG. 1. The direction of tripping, or the direction in which the relays are looking, is also indicated by the positive direction of current flow and the corresponding generation of a difference according to FIG. 2. Thus, a short-circuit or fault at location x2 will be considered to constitute a reverse fault, which, in the explained manner, can lead to faulty tripping of the distance relay RD, and specifically in the first zone, while in subsequently switched-in further relay protection zones there generally no longer occur any disturbing or interfering oscillations. The resonant circuit, in the embodiment under consideration is constituted by the components C, $Z_{Lr}$ and $Z_{Sr}$. With a relay of reverse polarity, looking towards the left, the same holds true for the components C and $Z_{Ll}$ and $Z_{Sl}$. The component C is a series capacitor and the other components $Z_{Lr}$, $Z_{Sr}$, $Z_{Ll}$, $Z_{Sl}$ are impedances.

Figure 2:
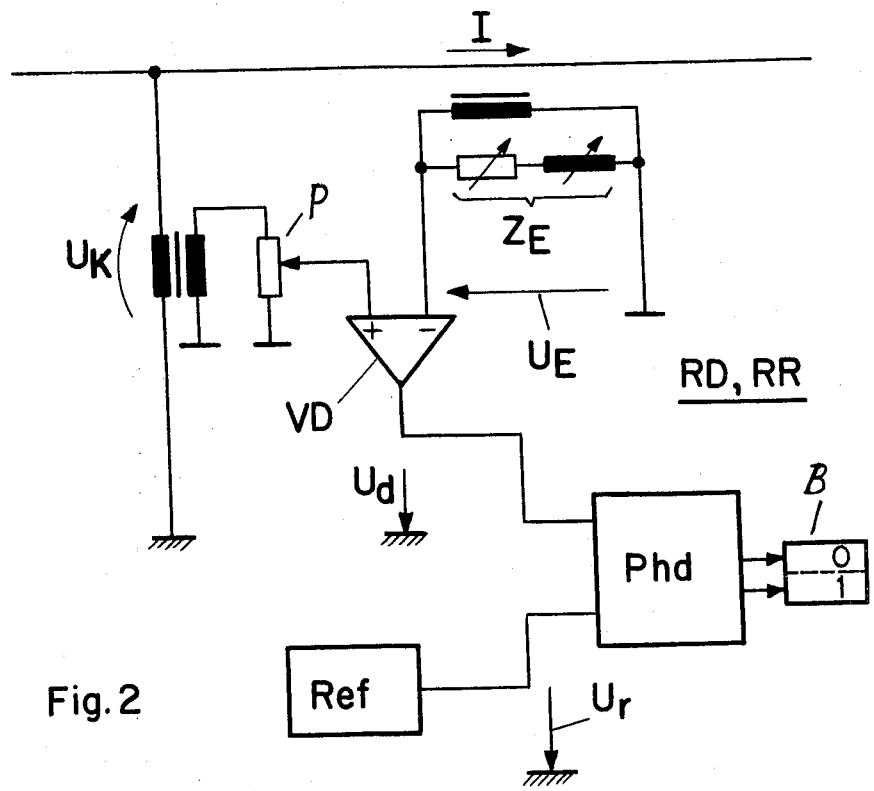
FIG. 2 illustrates a principle circuit diagram of a directional or distance relay employed in the invention.

According to the showing of FIG. 2, the difference voltage $U_d$ is formed in a standard difference former VD, such as a differential amplifier, by subtracting the line-image voltage signal $U_E$ from the line voltage signal $U_K$ (or an appropriately adjusted proportion thereof, as is possible through the use of the potentiometer P). The image impedance $Z_E$ is adjustable or in the case of a distance relay having staggered zone monitoring can be appropriately switched, as such is generally known in this technology and therefore need not here be further described. A phase angle-threshold detector Phd transmits a tripping signal by means of a binary output element B whenever the phase angle between the difference voltage $U_d$ and a reference voltage $U_r$, delivered by a transmitter Ref exceeds a predetermined threshold value or limit, amounting to for instance 90°. Basically, there is used as the magnitude $U_r$ the line voltage signal $U_K$, producing a trip circle in the complex plane extending through the null point or origin. However, it is particularly advantageous to use a so-called "memory voltage" as a reference voltage, thereby expanding the trip circle which then encompasses the origin. In this way there is additionally rendered more difficult faulty relay tripping, especially also with line voltages having more or less great capacitive components. It is advantageous for the reference voltage transmitter Ref to deliver an alternating-current voltage signal derived from a line voltage or a combination of line voltages and which alternating-current voltage signal is at least approximately independent of the occurrence of the fault for a limited amount of time.

In practice, the aforementioned transient oscillations hardly are troublesome in single-phase short-circuits or ground faults of multi-phase systems, but they are with two-phase short-circuits, the basic relationships are to be understood equally as for single-phase conditions as shown in FIG. 1.

Figure 3:
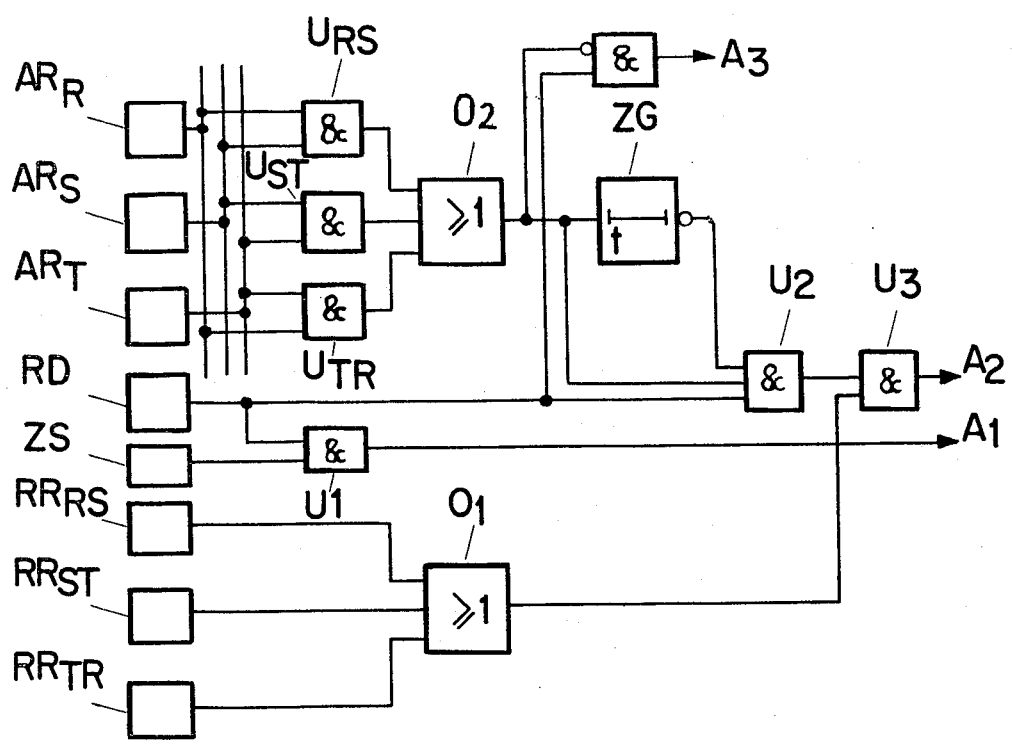
FIG. 3 is a logic circuit diagram for performing logic operations upon the signals of corrected directional relays and a standard set or adjusted distance relay having staggered fault distance monitoring.

Now in FIG. 3 there is shown an evaluation logic circuit for two-phase short-circuits or faults in a three-phase system. For the phase linkages RS, ST and TR there is provided, according to the invention, a respective directional relay $RR_{RS}$ and $RR_{ST}$ and $RR_{TR}$, which have been corrected in the manner explained heretofore in accordance with the teachings of the invention. The outputs are combined by means of an OR-gate O1 and applied to an AND-gate U3, which additionally receives the output signal from a distance relay RD having a timing circuit ZS. The blocking, in the presence of a logic signal "0", of a directional relay, with correctly detected reverse fault, thus blocks by means of the AND-gate U3 the possible tripping action (logic signal "1") of the distance relay RD. The output A2 thus carries a corrected monitoring signal for the first zone (zone 1) of the distance relay RD. After switching to the second zone (zone 2) the timing circuit ZS causes, by means of an AND-gate U1, a tripping action at a further output A1 every time the relay RD responds.

In order to limit the correction to two-phase short-circuits or faults there are provided excitation or starting circuits $AR_R$, $AR_S$, $AR_T$ operatively associated with the individual phases R. S. T and having AND-gates $U_{RS}$, $U_{ST}$, $U_{TS}$ linking them logically in accordance with the phase linkages. The output of an OR-gate O2, combining these linkages disjunctively, thus delivers a release or enable signal (logic state "1") only if a random two-phase fault or short-circuit occurs. This release or enable signal is needed for the trip signal at the output A2 because of an AND-gate U2 which is connected in circuit between the distance relay RD and the AND-gate U3, this AND-gate U2 being controlled at one input by the element or OR-gate O2. After elapse of a predetermined time t the AND-gate U2 is blocked by timing element ZG having a negating output (inverter), and thus, the release or enable signal is terminated. Consequently, there is taken into account the situation where a memory voltage generated in conventional manner by means of the resonant circuit as the magnitude $U_r$ will only be available for a limited amount of time.

Additionally, there is provided for the case of a three-phase short-circuit or fault at an output A3 a tripping action independent of the corrected directional relay and depending upon RD and O2 (any given fault in more than a single-phase).

While there are shown and described present preferred embodiments of the invention, it is to be distinctly understood that the invention is not limited thereto, but may be otherwise variously embodied and practiced within the scope of the following claims Accordingly,

What we claim is:

1. In a method for fault direction determination with respect to a measuring location at electrical lines having a series capacitor, wherein the phase angle of the difference of a line-image voltage signal and a line voltage signal at the measuring location in relation to a reference voltage signal is compared with a threshold value and upon falling below or exceeding such threshold value there is derived a fault direction signal, there being employed as the line-image voltage signal the potential drop across an image impedance to which there is applied a line current signal, and in the tripping or forward direction with regard to the measuring location and determined by the positive direction of current flow, there is provided a network section having a line impedance and a current source having a source impedance and the magnitude of the source impedance is the same or greater than that of the line impedance, the improvement which comprises:

determining the fault direction in place of the shortest protection zone setting of a multi-zone staggered fault distance monitoring system;

generating the line-image voltage signal by means of an image impedance; and the image impedance which generates line-image voltage signal is greater in magnitude than the magnitude of the line-impedance corresponding to the shortest protection zone of the fault distance monitoring system.

2. The method as defined in claim 1, further including the steps of:

generating the line-image voltage signal by means of an image impedance whose magnitude is greater than that of the total network impedance within at least one of the tripping and forward direction with respect to the measuring location.

3. The method as defined in claim 2, further including the steps of:

utilizing as the reference voltage signal an alternating-current voltage signal derived from at least one of a line voltage and a combination of line voltages and at least approximately independent of the fault occurrence for a limited amount of time.

4. The method as defined in claim 1, further including the steps of:

utilizing as the reference voltage signal an alternating-current voltage signal derived from at least one of a line voltage and a combination of line voltages and at least approximately independent of the fault occurrence for a limited amount of time.

5. The method as defined in claim 1, wherein said fault direction is determined simultaneously with said shortest protection zone setting.

6. A method for fault direction determination with respect to a measuring location at an electrical line having a series capacitor, comprising the steps of:

providing a relay arrangement having directional and distance characteristics;

generating a line-image voltage signal by means of an image impedance of the relay arrangement; and the image impedance generating line-image voltage signal being greater in magnitude than the magnitude of the line-impedance corresponding to a given protection zone of the relay arrangement.

7. The method as defined in claim 6, wherein:

said given protection zone of the relay arrangement constitutes the shortest protection zone of said relay arrangement.

8. An apparatus for fault direction determination with respect to a measuring location at electrical lines of a network having a series capacitor, comprising:
- a phase angle-threshold value detector having an input side;
- a difference signal former connected in circuit with said detector;
- a reference voltage transmitter connected in circuit with said detector;
- each said diffence signal former and said reference voltage transmitter having a respective output side;
- the input side of said phase angle-threshold value detector being connected with the output side of the difference signal former and with the output side of the reference voltage transmitter;
- said difference signal former having an input side;
- a distance protection relay means including an image impedance through which flows a line current signal;
- a signal transmitter associated with the line voltage at the measuring location;
- the input side of the difference signal former being connected with the image impedance and the signal transmitter;
- said distance protection relay means having staggered, switchable protection zone settings provided at the same measuring location and correlated with the shortest protection zone setting; and
- the magnitude of said image impedance being greater than the magnitude of a line impedance corresponding to the shortest protection zone of the distance protection relay means.

9. The apparatus as defined in claim 8, wherein:
the magnitude of the image impedance is greater than the magnitude of the network impedance in the tripping or forward direction of the relay means with respect to the measuring location.

10. The apparatus as defined in claim 9, further including:
- a reference voltage transmitter for delivering an alternating-current voltage signal derived from at least one of a line voltage and a combination of line voltages and which alternating-current voltage signal is at least approximately independent of the occurrence of the fault for a limited amount of time.

11. The apparatus as defined in claim 8, further including:
- a reference voltage transmitter for delivering an alternating-current voltage signal derived from at least one of a line voltage and a combination of line voltages and which alternating-current voltage signal is at least approximately independent of the occurrence of the fault for a limited amount of time.

12. The apparatus as defined in claim 8, wherein: said difference signal former is a differential amplifier.

13. An apparatus for fault direction determination with respect to a measuring location at an electrical line having a series capacitor, comprising:
- relay means having directional and distance characteristics for determining the presence of a fault at least at one predetermined region of the electrical line; and
- said relay means being structured such that it contains an image impedance which generates a line-image voltage signal greater in magnitude than the magnitude of the line impedance of at least said prdetermined region of the electrical line.

14. The apparatus as defined in claim 13, wherein:
said predetermined region of the electrical line corresponds to the shortest protection zone of the relay means.

* * * * *